Oct. 22, 1957 L. P. HUNTER ET AL 2,810,870

SWITCHING TRANSISTOR

Filed Nov. 22, 1955 3 Sheets-Sheet 1

BY

INVENTORS
LLOYD P. HUNTER
RICHARD F. RUTZ
GARDINER L. TUCKER

Alvin J. Riddles
AGENT

Oct. 22, 1957 L. P. HUNTER ET AL 2,810,870

SWITCHING TRANSISTOR

Filed Nov. 22, 1955 3 Sheets-Sheet 2

*INVENTORS*
LLOYD P. HUNTER
RICHARD F. RUTZ
GARDINER L. TUCKER

*BY* Alvin J. Riddles
AGENT

Oct. 22, 1957 L. P. HUNTER ET AL 2,810,870

SWITCHING TRANSISTOR

Filed Nov. 22, 1955 3 Sheets-Sheet 3

INVENTORS
LLOYD P. HUNTER
RICHARD F. RUTZ
GARDINER L. TUCKER

BY Alvin J. Riddles
AGENT 2,810,870
Patented Oct. 22, 1957

2,810,870

SWITCHING TRANSISTOR

Lloyd P. Hunter, Poughkeepsie, Richard F. Rutz, Fishkill, and Gardiner L. Tucker, Glenham, N. Y., assignors to International Business Machines Corporation, New York, N. Y., a corporation of New York Application November 22, 1955, Serial No. 548,310

9 Claims. (Cl. 317—234)

This invention relates to transistors and particularly to switching transistors for use in information handling machines.

In the development of electronic information handling machines employing junction transistor circuits it has been found advantageous to convert the information passing through the machine to a series of differences in D. C. level. This presents a problem in transistor circuit design that is unique to information handling machines in that active circuit elements sense only the presence or absence of input signals, whereas with communications circuitry, the active circuit element is required to accurately reproduce the shape of the input signal. However, in order to economically and reliably provide such transistor circuitry it has been found essential to establish the different D. C. levels by driving the active circuit elements of such transistor circuits from a complete cut off into saturation, when the presence of an input signal pulse is sensed. This in circuit terms means that the active transistor element must traverse its complete output characteristic, passing through the small signal region wherein the transistor has low frequency response and low amplification factor, through a linear or active region of the transistor, and into saturation, in which region the frequency response rapidly diminishes and the amplification factor approaches zero. This may be defined as large signal transistor operation whereas operation limited to the linear or active region of the transistor is defined as small signal operation.

It has been found that transistor circuit design for large signal operations requires a special type of transistor having certain parameters controlled that will permit the transistor to have as high an alpha and frequency response in the small signal region of the output characteristic as possible, and which when driven into saturation can be brought out of saturation to cut off with a minimum of carrier storage. Without such a transistor the design of switching component circuits requires the use of clamping circuits and power limiting circuits to accomplish what can best be done in the transistor itself and the use of these imposes a serious limitation on speed of operation. A junction transistor meeting these requirements for switching purposes will have a high base to collector current amplification factor, a very low on resistance, a high avalanche or Zener breakdown voltage, a very low storage time, a specific emitter to base breakdown voltage, a high punch through voltage, and for optimum frequency response the capacitive reactance in the collector circuit should be very low. Such a transistor has not heretofore been available in the art.

Each of these items contributes to provide an output characteristic in switching transistors whereby; a transistor may be driven from cut off to saturation in an extremely short period of time and similarly may be brought from saturation to cut off in an equally short period of time; it may drive heavy loads and is capable of dissipating the heat generated within the device itself under continuous duty.

The high base to collector amplification factor is essential in order that a single component circuit may be capable of switching greater loads. This in terms of machine design means that large groups of similar component circuits may be attached in parallel with a load of specific component circuits; a typical example being the driving of a memory matrix.

The "on resistance" factor is a measure of the ohmic resistance internal to the collector stage of the transistor and this value causes a shift in level between the input and the output of the transistor. Each shift in level, through very small, causes the input section of a subsequent component circuit stage to be biased in the forward direction and thus the magnitude of the "on resistance" acts as a limitation on the number of stages that can be placed in series in a machine with a given separation between on and off signal levels. In addition to this, the "on resistance" is also a direct factor in the amount of power dissipated in the device itself. Thus the greater the "on resistance" the more power that is dissipated within the semiconductor material. This dissipated power is transformed into heat and results in a change in ambient temperature which may cause a variation in the parameters of the transistor.

The avalanche breakdown of a transistor occurs when the carriers achieve sufficient velocity that the impact of a collision between each carrier and an atom in the crystal lattice transfers sufficient energy to drive an electron into the conduction band. The value of collector voltage at which this occurs is a function of the size of the region of the transistor influenced by the field associated with the collector junction. Avalanche breakdown permits the flow of excessive current and possible component damage.

The storage time factor in a switching transistor is responsible for the time delay required for the signal level at the collector to return to the off level when the signal at the input returns to the off level. This time delay may be an appreciable part of the pulse duration at higher frequencies. It is caused by the presence of carriers in the base region of the transistor. The effect of these carriers present in the base is that, as they arrive at the collector barrier, they reduce the "back resistance" of the collector barrier and permit a current to continue to flow in the collector circuit. Since in large signal operation the transistor is driven into saturation, the quantity of these carriers present is much greater than when operation is confined to the linear or active region only and hence these carriers present a serious problem in high frequency switching operations. This problem has been attacked in the art, for example by the use of circuit techniques such as overdriving and clamping at a desired level and by transistor construction wherein the carrier lifetime of the base material is very short. Even this, when done to the limits of the semiconductor fabrication technology and circuit design, has not been capable of providing a transistor component circuit with a cut off collector current sufficiently short so that high frequency response of the component circuit is possible.

The specific emitter to base breakdown voltage is a built in clamp which permits the transistor to be pulled only so far into cut off and no further so that an accurately predictable time will be required to initiate conduction.

The "punch through" voltage of a transistor is reached when the depletion layer associated with the biased collector junction covers the entire base region and reaches the emitter. The penetration of the depletion layer into the base region is a function of the operating collector voltage and the base resistivity.

The capacitive reactance of the collector circuit represents a time loss in signal response in the form of energy stored in the immediate environment of the device. This loss is often made a more appreciable part of the pulse duration time when the mass of the switching transistor is increased for heat dissipating reasons described above.

Each of the above factors introduces into the design of switching circuits serious limitations which because of their conflicting nature have not been avoidable with transistors heretofore available and hence have resulted in an upper limit of frequency response and current carrying capacity being placed on component switching circuits. Thus, in order to provide higher power, more reliable and higher speed switching circuits a transistor specially designed for switching operations has been found necessary.

Accordingly, what has been discovered is a transistor having parameters such that it is ideal for switching applications and a method of fabricating such a transistor to provide these advantages.

The transistor of this discovery embodies the above requirements into a single structure, whereby, a combination of types of elements and geometry provide many features some of which in the past had to be gained through special circuit design and others have not been available at all heretofore in the art. Moreover this structure in combination with a novel encapsulation arrangement is capable of the high power handling ability of more massive structures. This transistor has the following features. A graded resistivity base region is provided which produces an electric field within the base region of the transistor and the presence of this electric field adds a drift component to the diffusion component of motion of the carriers in the base region so that injected minority carriers can reach the collector barrier more rapidly and the carriers that are stored when the input returns to the no signal level will more rapidly be swept out of the base region. The transistor is equipped with an alloy junction emitter having essentially constant injection efficiency over the entire surface of the junction and a specific emitter to base breakdown voltage. A collector junction is provided having a cross sectional area equivalent to that of the base region and having the comparable resistivity in the semiconductor material on each side of the junction. The device is encapsulated in a novel, environment controlling, and heat dissipating vehicle.

A primary object is to provide an improved switching transistor.

Another object is to provide a transistor which may be driven from cut off to saturation and back to cut off at a higher frequency.

Another object is to provide a method of making a switching transistor.

Still another object is to provide a switching transistor made by the gaseous diffusion technique wherein the minority carrier injection efficiency of the emitter junction is constant over the entire area of the junction.

Another related object is a method of providing heat dissipation through the material that also serves as a filler for the container in which the transistor is sealed.

Still another related object is to provide a method of making interim performance evaluations as the transistor is being fabricated to establish the exact base thickness desired.

Other objects of the invention will be pointed out in the following description and claims and illustrated in the accompanying drawings, which disclose, by way of example, the principle of the invention and the best mode, which has been contemplated, of applying that principle.

Figure 1:
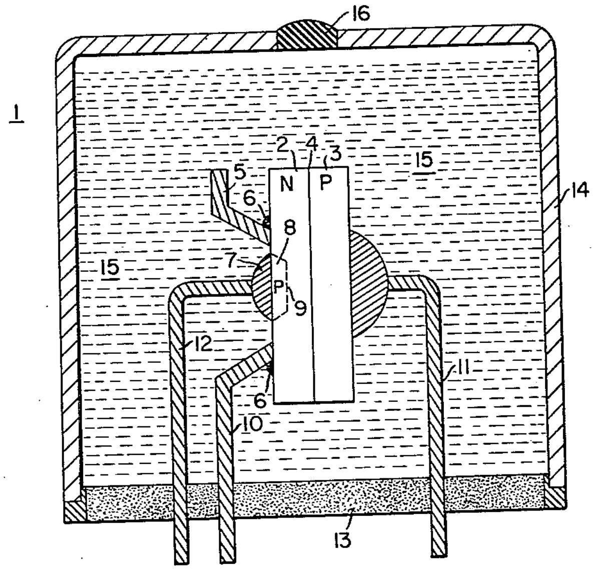
Figure 1 is a schematic view of a PNP switching transistor of the type involving this invention.

Referring now to Figure 1, a PNP junction switching transistor is shown, constructed and encapsulated in such a manner as to provide performance especially suited to information handling operations. The transistor 1 of Figure 1 comprises a N type body region 2 and a P type collector region 3 joined at a junction barrier 4. On one surface of the base region 2 a circular base tab 5 makes an ohmic connection 6 to the base region 2. In the center of the opening of the base tab 5 an alloy junction emitter 7 joins the base 2 forming a P region 8 and a junction barrier 9 in the base region 2. Connections 12, 10 and 11 are attached to emitter, base and collector regions respectively and pass through a suitable insulator and sealer 13 such as glass. An airtight package cover 14 such as a metal can is sealed as by soldering to the sealing mount 13. The entire package is filled with an environment controlling and heat conducting fluid 15 having a low dielectric constant, for example, compounds of the family ($C_6H_3$—1,3,5—$(CH_3)_3$) of which mesitylene is a member, and the container 14 is sealed at 16 with a suitable sealant such as plastic or solder. The features described above, in combination with the specific effects of this structure, and the technique of encapsulation, provide a transistor in which many of the factors heretofore considered as limitations in the design of information handling circuitry are incorporated into the device itself so as to provide a wider range of freedom in circuit design, a higher speed of operation, a higher power handling ability and higher frequency response than in transistors known heretofore in the art.

The switching transistor of this invention may be made by a number of ways established in the art, however, when these conventional methods are incorporated into the making of a device such as this transistor wherein the elements of the transistor, the geometric arrangement of those elements and possibly even the manner of encapsulating the completed transistor all contribute to the superior performance of the device, it has been found that, unless the individual methods cooperate in the production of the device, an expensive structure results. In order to insure the quality and reliability of this switching transistor a novel process of manufacture has been developed wherein the method of manufacture at each stage has been provided so that in combination the steps will produce this transistor in fewer steps than has heretofore been possible in the art. In a highly competitive field wherein large quantities of devices are made from a single process an economical advantage acquired by virtue of an improved process is a significant step in the art.

Figure 2:
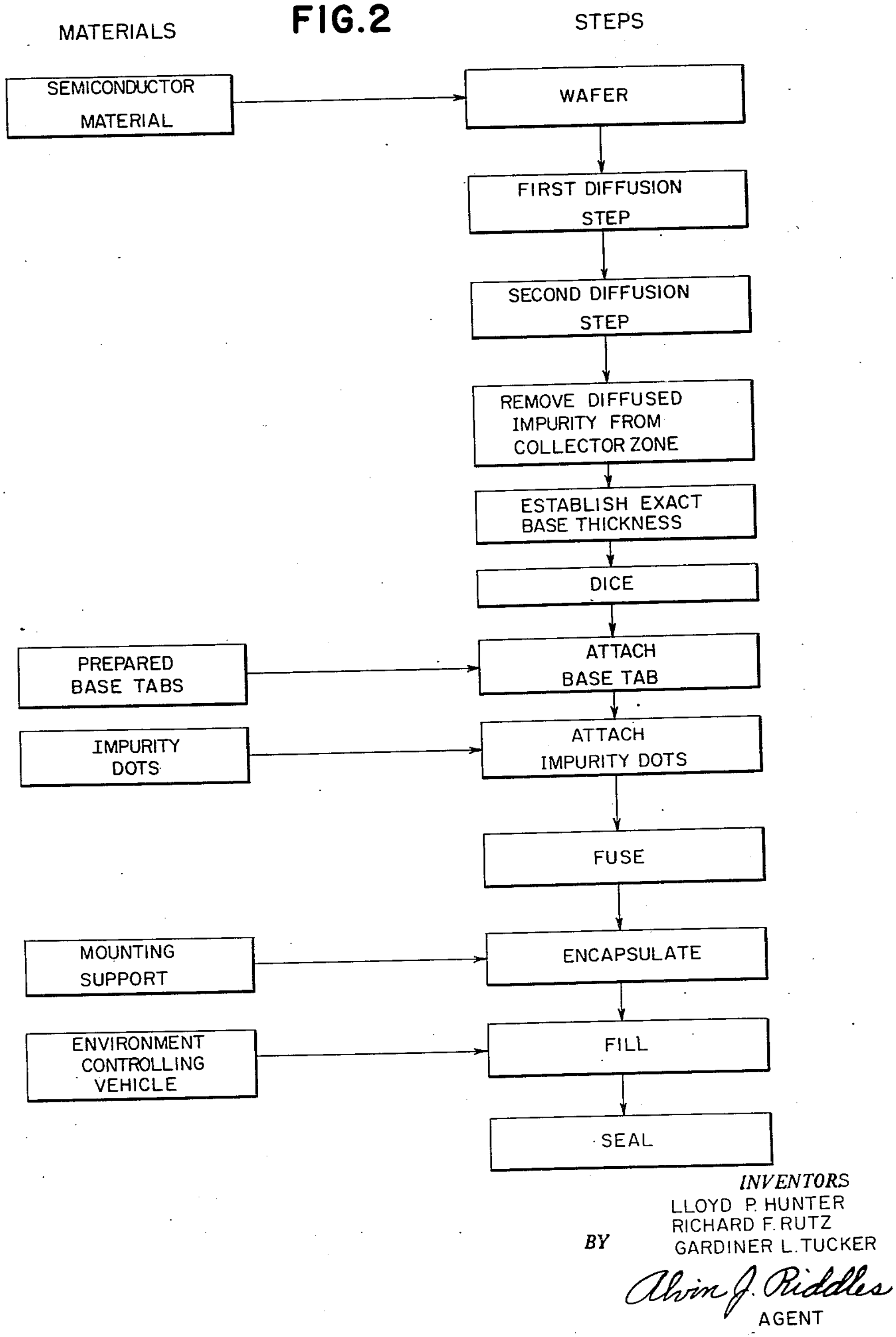
Figure 2 is a flow chart showing the preferred method of manufacturing the transistor of this invention.

Referring now to Figure 2 a flow chart is shown of a novel method of manufacturing this transistor. The column at the left of the chart indicates the materials used in the manufacturing operation and each material is connected to the step in which it is introduced into the process.

The first six steps of the process provide a body for the transistor of this invention. These steps show a novel manner of providing such a body, however, it should be understood that other methods may be devised by one skilled in the art to provide the transistor body. The first six steps provide a semiconductor transistor body having base and collector zones of opposite conductivity separated by a junction barrier. The base zone is provided with a resistivity that is low at the surface and constant to the depth of an alloy junction to be later applied, and an exponential grading of resistivity from the low value at this depth to a higher value at the junction barrier. The collector zone is provided with resistivity graded from a high value at the barrier to lower values as the distance from the barrier increases.

The semiconductor material selected for the transistor should be monocrystalline and to insure a plane parallel alloy junction it should be cut parallel to a suitable low index crystallographic plane for providing plane parallel junctions. The resistivity of the material should be sufficiently high to permit an acceptable resistivity gradient to be acquired by vapor diffusion in a base thickness near the diffusion distance of the carriers during the carrier lifetime of the material. The resistivity meeting these requirements will depend upon many physical properties of the material and the selection may be made by anyone skilled in the art. As a specific example monocrystalline, P type, germanium, semiconductor material having a resistivity of 2 ohm centimeters has been found to be satisfactory.

The semiconductor material is first cut into wafers having the major surfaces parallel to a low index crystallographic plane suitable for producing plane parallel alloy junctions. Such a satisfactory plane is the 111 crystallographic plane. The thickness of the wafer should at least be the thickness of the desired collector region plus twice the thickness of the base region. Since the thickness of the base will not be greater than the diffusion distance of the semiconductor material, this distance is easily established. The thickness of the collector region should be at least sufficient to enable application of an external ohmic connection without shorting out the collector junction. As a specific example here, the wafer thickness for the semiconductor material described above would satisfactorily be .007 inch.

The semiconductor wafer is next placed in a controlled atmosphere at a high temperature and a conductivity directing impurity of the type opposite to that of the wafer is diffused. The impurity penetrates the surface of the wafer converting the conductivity to the opposite type in such a manner that an exponential gradient of resistivity is obtained in the crystal from nearly zero at the surface to the value of the resistivity of the crystal wafer.

Figure 3:
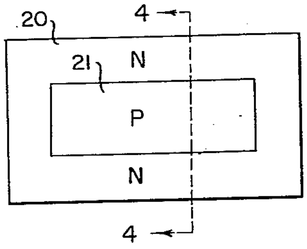
Figure 3 is a view of a crystal wafer after diffusing impurities into it.
Figure 4:
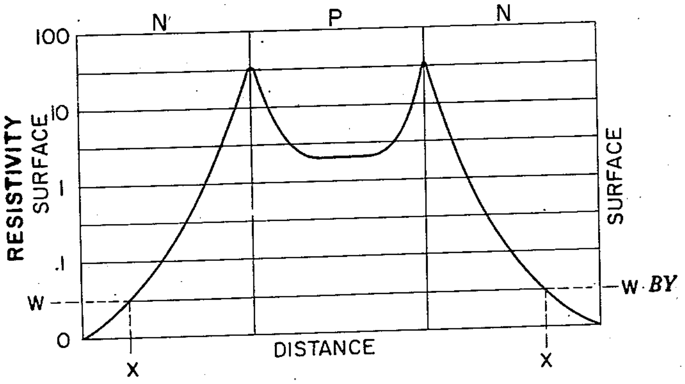
Figure 4 is a curve showing the variation of resistivity in the wafer from one surface to the other.

Theoretical arguments indicate that in order to provide an optimum field in the base of the transistor the gradient of resistivity in the base region should follow approximately an exponential function. The introduction of impurities into the wafer by the technique of gaseous diffusion converts a portion of the crystal to the opposite type of conductivity and provides a region having a gradient of resistivity that is nearly exponential and is believed to very closely approach the optimum. The technique of gaseous diffusion is well known in the art and is accomplished by heating the crystal wafer in the presence of a vapor containing a conductivity directing impurity of the type opposite to the conductivity of the crystal so that the energy imparted by the heat to the impurity atoms causes them to penetrate into the crystal surface. This produces a region of opposite conductivity in the crystal and provides this region with a resistivity that is near zero at the surface and is nearly equal to the intrinsic resistivity of the crystal at the junction. The results of this gaseous diffusion are illustrated in Figures 3 and 4. In Figure 3 a cross sectional view of a wafer prepared as described above is shown. Here the region 20 adjacent to the surfaces of the wafer 21 has been converted to the opposite type conductivity material. If the wafer 21 is cut along the line 4—4 the resistivity of the semiconductor material will vary as is shown in Figure 4. The resistivity in the crystal 21 varies from zero at the surfaces to the intrinsic as is shown in the figure. As a specific example here, a 2 ohm centimeter resistivity P type Germanium wafer .007 inch thick when heated for 19 hours at 800° C. in an hydrogen atmosphere containing $1 \times 10^{16}$ arsenic atoms per cubic centimeter was converted to N type conductivity on all surfaces to a depth of .001 inch.

The next step is performed to provide a constant injection efficiency gamma ($\gamma$) over all of an alloyed emitter junction surface to be later provided. The effect of gamma ($\gamma$) on a junction transistor and the fact that gamma is affected by the resistivity of the semiconductor material immediately adjacent to the junction are established in the art. However, the fact that gamma ($\gamma$) can vary over the surface of an alloy junction is a problem unique to junction transistors with a graded resistivity base region. This may be seen in connection with Figure 4 wherein if an alloy junction is made into the surface to a depth indicated as X then the resistivity of the semiconductor material immediately adjacent to the junction will vary over the range indicated by the curve. This in turn produces a variation in gamma over the surface of the junction. In order to provide a transistor with high injection efficiency and accurately reproducible characteristics, it has been found necessary to control gamma. This control is provided by a second diffusion step which is performed in a vacuum in the presence of heat. In this operation the heat imparts energy to the impurity atoms in the crystal and since the concentration of these atoms is greatest at the surface the effect on the distribution will be most noticeable at this point. The heat causes migration of some of the atoms deeper into the crystal lowering thereby the resistivity at that point and at the same time it permits some atoms to escape into the vacuum. Thus this second diffusion operation acts in two directions to level out the resistivity curve in Figure 4 in the region to be occupied by the junction. The new curve is illustrated in Figure 4 as dotted curve W. As a specific example of this operation the wafer described in connection with the preceding step, if heated for one hour in a vacuum will have a constant resistivity of approximately .1 ohm centimeter to a depth of near .0002 inch.

This method is disclosed and claimed in copending application Serial No. 607,781, filed September 4, 1956, and assigned to the assignee of this application.

The next step is to remove from the wafer any material not necessary in the formation of the body of the transistor. This is accomplished in such a manner that a wafer of material as shown in Figure 5 is provided.

Figure 5:
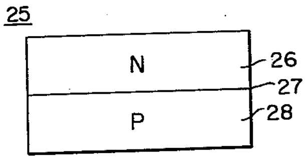
Figure 5 is a view of the body of the transistor after removal of the material not required for the body.

Referring now to Figure 5, there is shown a cross-sectional view of a wafer of semiconductor material from which bodies of transistors of the type of Figure 1 may be cut. The wafer 25 comprises a graded resistivity N region 26, a junction barrier 27 and a resistivity in the P region 28 which is graded only near the junction. The removal of the material from the wafer of Figure 3 to provide the wafer of Figure 5 may be performed in any conventional manner such as sawing, etching or abrading. It is also possible by providing proper crystal thickness in the starting wafer, to use a longitudinal saw cut and a little end trimming on the wafer of Figure 3 to produce two wafers as in Figure 5.

It is essential that the base region thickness be very accurately established. The reasons for this is that a junction emitter to be later applied should penetrate into the base region only as far as the depth of constant resistivity, a specific ratio of resistivity at the emitter junction to be later applied is necessary for a specific emitter to base breakdown voltage, and a definite base thickness necessary for a given frequency response. There are a number of ways in the art to accomplish this and the following is a preferred method developed for its accuracy and because it permits the production of large numbers of devices with very closely reproducible characteristics. This method first involves the establishment of the junction location in the wafer. This is done by breaking off an edge of the crystal wafer and etching it with a suitable etch to cause an etch line to establish a reference to indicate the position of the junction. It has been discovered that there is a substantial discrepancy between the location of this etch line and the location of the true junction in the crystal so that the true junction is then established by a barium titanate deposition method known in the art. This discrepancy may be in the vicinity of .007 inch for the above example. The difference between the etch line and the true junction is then recorded. The wafer is now ground down to a value close to the desired base thickness using the etch line as a guide to indicate how far the surface is from the true junction. A point probe and another connection are made to the base region surface and the reverse breakdown voltage between the probe and the surface is measured. This method is disclosed and claimed in copending application Serial No. 611,999, filed September 25, 1956, and assigned to the assignee of this application. The surface is etched away until the desired breakdown voltage is established. This then gives a wafer with an established graded resistivity region thickness from which many transistor bodies may be cut. It should be noted that the probing and etching operation could be performed without the etch line determination. This, however, is time consuming and the above mentioned discrepancy between the etch line and the true junction serves as a cross check on the diffusion operation. The diffusion operation on a particular wafer may easily become contaminated or an error may be made and such an occurrence will cause the etch line to appear far from where it is expected. This indication permits discontinuing work on that particular wafer before a great deal of fabrication time has been spent on it.

Having established the base thickness, the wafer is now diced into transistor bodies. This is usually done by sawing the wafer into small squares. In the structure of this invention it has been found possible to make the transistor body extremely small. In the example described in the previous steps the individual die that is to become the transistor body is found to be very satisfactory at .010 inch square.

Figure 6:
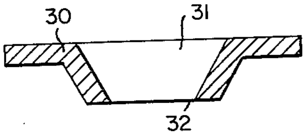
Figure 6 is a cross sectional view of the base tab of this transistor.

Each die is now equipped with a specially formed base tab. This is preferably done by taking a base tab and applying by a technique such as soldering it to the surface of the graded resistivity region of the dice using only sufficient heat to make the solder connection. The specifically formed base tab is piece of good conducting metal having a hole through it at one point. The base tab may also be equipped with a cone to set it away from the crystal. Such a base tab is shown in Figure 6 and could preferably be fabricated by striking a .005 inch thick, .100 inch wide nickel strip 30 with a center punch at a point 31 and abrading off part of the area so deformed to provide a hole 32 which will be about .007 inch in diameter. It is important only that the hole in the base tab be large enough to accommodate an alloy junction emitter to be later applied and that it not be so large as to prevent the base tab from bearing on the dice at all points around the periphery. In other words the hole should not be larger than the width of the crystal dice or structural support will be lost. To keep the base resistance of the device low, the distance from the emitter junction to be later applied to the base connection should be as small as possible.

The next step in the process is to apply to the surfaces of the die selected quantities of conductivity directing impurities so that on a subsequent firing operation an ohmic connection will be made to the constant resistivity region and a rectifying contact to the graded resistivity region. Small spherical shaped quantities of conductivity directing impurities or of gold containing such impurities are available and are known in the art as "Impurity Dots." These may be applied either by pressure, soldering or by mounting in a suitable crucible so that they will be in contact with the proper die surfaces when fired. In order to provide the emitter of the switching transistor of this invention inside the hole in the base tab the small quantity of impurity should have a dimension sufficiently small so that when alloyed into the die the base tab will not short out the junction. The size of the impurity quantity for the ohmic connection is not so critical and a simple 1 to 1 relationship of sphere diameter to die width is adequate. As a specific example for the transistor of Figure 1 the emitter impurity is a spherical body of indium .0025 inch in diameter and the collector ohmic contact is also an indium sphere about .010 inch in diameter. Lead wires to the emitter and collector may also be applied here so as to be attached in firing.

Having applied the impurity materials the assembly is fired at a temperature sufficient to fuse the impurity and cause it to form an alloy with the semiconductor material. At this temperature, the alloy formed with the graded resistivity region has a predominance of opposite type conductivity directing impurities and a rectifying junction is produced, whereas the alloy produced in the constant resistivity region has a predominance of the same conductivity type directing impurities or is neutral so that an ohmic connection results. The depth of penetration of the alloy region for the rectifying contact should not exceed the region of constant resistivity provided as described above in order to insure constant gamma over the surface of the emitter. The depth of penetration of the alloy region in a given time may be readily established by one skilled in the art with a knowledge of the semiconductor material, the type of impurity and the temperature. In the specific example described above, firing at 600° C., for two minutes, produces a rectifying junction penetration of .0002 inch. The junction so produced will be parallel with the surface of the crystal because of the crystallographic orientation of the crystal material.

An alternate step to provide the desired constant gamma ($\gamma$) over the emitter junction surface may be performed at this point. This step involves etching the surface of the base region of the transistor to the point where the junction contacts the region only along a single plane and hence a constant resistivity is present over the surface of the junction. The use of this step eliminates the second diffusion step described above but this step can be performed only after the emitter junction has been formed.

The device is now assembled in a suitable airtight container, for example a metal can with a glass mount as illustrated in Figure 1 or an all glass envelope such as a subminiature electron tube cover. The emitter, base and collector leads are brought out through the sealed container for external circuit connection either in pluggable fashion as shown in Figure 1 or in any other convenient manner.

The next step is the filling of the space inside the container not occupied by the transistor. This is done by introducing a special environment controlling, and heat dissipating liquid into the space. This liquid must be nonmiscible with water, have a high boiling point and a low dielectric constant. Liquids meeting these requirements are the chemical family of which mesitylene $$(C_6H_3\text{—}1,3,5\text{—}(CH_3)_3)$$

is a member.

The use of this material is disclosed and claimed in copending application Serial No. 607,782, filed September 4, 1956, and assigned to the assignee of this application.

The final step in the process involves sealing of the container. This step will vary according to the container used. In the illustration of Figure 1 the container 13 is sealed at the opening by a heat sealing plastic 16.

The above process will provide a switching transistor having graded resistivity base region, a constant gamma alloy junction emitter, a specific emitter to base breakdown voltage, a symmetrical current flow in the base region, a low and accurately predictable "on resistance,"

a high punch through voltage, a high avalanche breakdown voltage, a structurally rugged base thickness, a low storage time and a low collector capacitance. In addition heat dissipating advantages are gained without the use of a massive heat sink. In the above description of the process of making this transistor only the major steps in the process have been stressed and that the fine points in the technology that result from the small sizes being handled and the etching solutions used have been omitted since they are familiar to one skilled in the art. Moreover, it should be remembered that the degree of purity required in semiconductor fabrication is greater than can be detected by spectroscopic means; for example one impurity atom in ten million crystal atoms is sufficient to alter conductivity; and, for this reason it is standard practice in the art to use extreme care in all stages of a semiconductor fabrication process so that this degree of purity may be preserved.

The following remarks are included to aid in understanding this transistor and to permit appreciation of all of the advantages provided by the above described transistor and method of making it.

Considering first, the base region 2 of the transistor, the base region has a graded resistivity from a factor that is low at the emitter to base junction 9 and rises exponentially to a value considerably higher at the base to collector junction 4. The purpose of such a variation in resistivity within the base region may be seen to advantage in connection with Figures 7 and 8.

Figure 7:
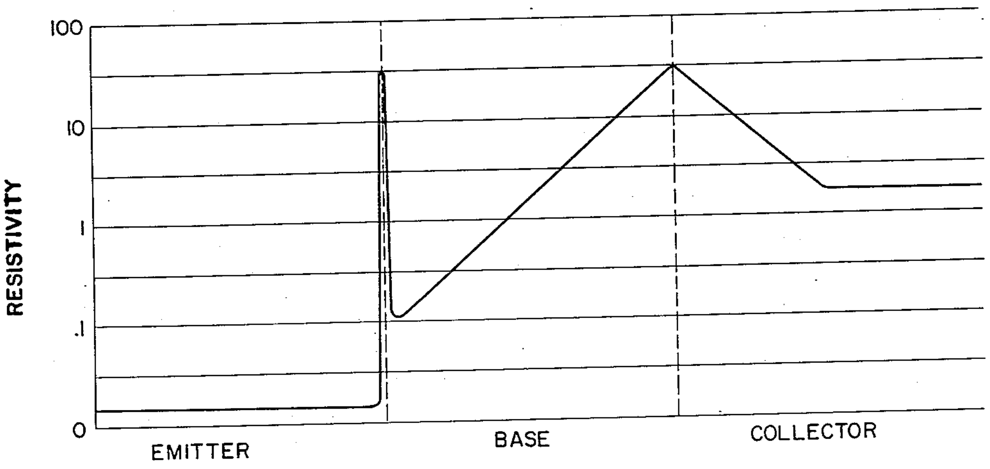
Figure 7 is a graph showing the variation of resistivity in the emitter, base and collector regions of the transistor shown in Figure 1.

Referring now to Figure 7 the log of the resistivity is plotted with respect to distance in the emitter region 7, the base region 2 and the collector region 3. It may be be observed that in the alloy emitter region the resistivity is extremely low at the emitter to base junction 9. There is a sharp rise in resistivity at the junction and then an exponential rise to a value at the collector to base junction 4. In the collector region the resistivity decreases with distance from the junction to a selected value remaining constant through the remainder of the collector region. The result of the exponential gradient of resistivity in the base region 2 is observed in connection with Figure 8 wherein the energy level diagram of this switching transistor is shown.

Figure 8:
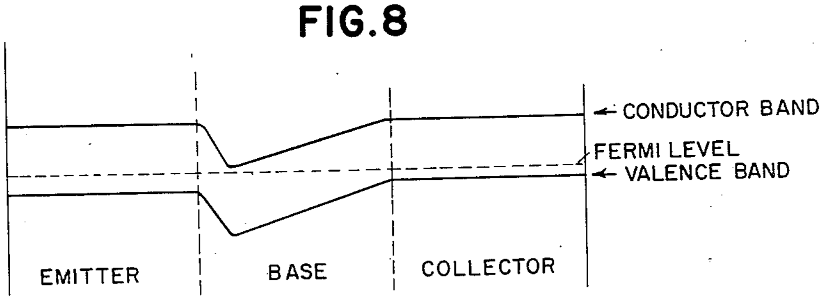
Figure 8 shows the variation in energy level in the respective regions of the transistor of Figure 1.

Referring now to Figure 8 the energy level of the conduction and valence bands of the semiconductor material are parallel to the Fermi level in the emitter and in the collector regions. Further, it is noted that this parallelism is sharply distorted in the base region and with the higher energy level being at the higher resistivity which is at the collector junction 4. Since it is established in the art that minority carrier holes in this example seek the highest energy level, the minority carriers injected by the emitter of this transistor will then be acted upon by an internal built in electric field which will cause them to drift in the direction of the collector junction 4. This will appreciably shorten the transit as well as the storage time of the transistor and enable operation at very high frequency. It has been established that the optimum increase of resistivity with distance in the base region should be an essentially exponential function of the distance from the emitter junction and it has been found that the method of gaseous diffusion of impurities into a semiconductor crystal closely approaches this function.

Considering next the collector zone 3, it is to be noted, referring to Figure 7 that the resistivity in this zone slopes away from the collector barrier in a manner similar to the resistivity in the base zone 2. The result of a collector construction of this nature is that the depletion layer associated with the collector junction under bias conditions will penetrate both into the base region and into the collector region and that the field associated with the collector junction will be spread over a greater distance. This may be contrasted with the conventional junction transistor wherein the collector region is generally of lower resistivity than the base region and it being known in the art that the penetration of the depletion layer, as a result of the operating collector voltage of the resistor penetrates into the particular zone adjacent to the barrier in proportion to the resistivity of the particular zone, then it may be seen that the transistor of this invention has a depletion layer which is appreciable on both sides of the junction.

Thus the combination of the resistivity variation in the base and collector regions on each side of the collector junction impart a unique performance to the transistor of this invention and provide thereby a simultaneous solution to two problems, the individual solutions to which had formerly been in conflict with each other. Formerly, the depletion layer associated with the collector advanced into the constant resistivity base region but because of the thin base region necessary for good frequency response the depletion layer could traverse this distance at low voltages. Thus to provide good punch through voltages thicker base regions were considered necessary.

For high frequency response on the other hand thinner base regions were required and the solution of either problem interfered with the other.

A fairly thin base region is provided in the structure that along with the built in field provides superior multimegacycle frequency response and at the same time punch through does not take place because as the depletion layer advances through the base region lower resistivities are encountered. Thus the closer the depletion layer approaches the punch through point the higher the collector voltage is required to advance it.

Avalanche breakdown is caused by the carriers being accelerated by a high field at the collector junction so that they would, by force of impact, on collision with atoms in the crystal, produce a critical number of new carriers. To reduce this high field, a widening of the collector junction is necessary. The transistor of this invention is constructed so that field of the collector junction is spread over a greater distance thereby reducing the high field below the critical value so that the avalanche breakdown voltage is increased.

Considering next the base tab 5 it is to be noted that it has a circular construction having an opening in the center and making contact with only a small ring of the surface of the base region 2. Several structural and circuit advantages are achieved in this construction, the first of these being that a soldered ohmic contact 6 may be readily made with a wide region of the crystal with a minimum of adverse heating effects. The circular tab is deformed in such a manner as to keep the bulk of material of the base tab away from the base of the N region 2 except at the ring of contact of ohmic connection 6. The opening in the base tab wherein the emitter 8 is mounted is provided in order to produce symmetry of current flow within the base region 2.

Another advantage achieved by this construction that is of both structural and circuit performance nature is that the base tab, having a large area and being in contact with the crystal, is capable of transferring heat, so that both the base tab and the crystal may radiate heat to the surrounding vehicle. In other words the base tab is in this shape acts as a cooling fin.

Considering next the alloy junction emitter 8 and its associated junction barrier 14, there are a number of not immediately apparent advantages acquired by the use of this construction. The first of these advantages is of a structural nature in that the junction emitter is highly resistant to shock and vibration and less likely to change its properties due to surface effects than other conventional types of emitters. The second of these advantages is that the alloy junction emitter has a higher injection efficiency than many other types of emitters known in the art. The injection efficiency of an emitter is, known as gamma ($\gamma$), which is a measure of the loss in the transistor due to the input signal being attenuated in the injection of minority carriers into the base, is one of several factors, the product of which determines the amplification factor of the transistor. Since it has been described above that the amplification factor of the transistor should be high, it is obvious that the use of an alloy junction emitter will enhance the amplification factor of the transistor and will thereby permit the switching of heavier component circuit loads. The alloy junction emitter of this transistor has two unique properties essential for switching purposes and which have not been available heretofore in comparable transistors. The first of these is the constant injection efficiency "gamma," over the entire surface of the alloy junction. The constant gamma coupled with the current flow symmetry described above provide accurately reproducible characteristics and a very low "on resistance." The second unique property is the specific emitter to base breakdown voltage. This is achieved by virtue of the very low resistivity of the semiconductor material adjacent to the junction and it results in a built in clamp being placed on how far the transistor may be cut off. Hence, turn on time is always a small, predictable percentage of the signal duration time.

Considering, finally the encapsulation technique, the fluid in which the transitor is immersed provides three distinct advantages. It excludes moisture, thereby reducing surface losses of the crystal, it reduces power loss into the environment by virtue of its low dielectric constant and it transfers heat by convection to the container. The transistor structure is turn is provided with a greater radiating surface by virtue of the fact that both the base tab and the crystal are surrounded by the fluid. These items in combination provide for the removal of heat and it is to be noted that whereas in most structures this heat removal is accomplished by attaching a large mass with corresponding increase in capacitance here there is no heat sink mass and the capacitance is kept small by the low dielectric constant of the fluid.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. For example, while a PNP structure and process for making it have been described, an NPN structure and process could readily be achieved by one skilled in the art. It is the intention therefore, to be limited only as indicated by the following claims.

What is claimed is:

1. A switching transistor comprising a semiconductor body wafer including a base region and a collector region separated by a junction barrier, said base region having a gradual variation of resistivity from a low value at the exposed surface of said base region to a higher value at said barrier, said collector region having a gradual variation of resisitivity from a high value at said barrier to a lower value in the remainder of said region, an ohmic connection to said collector region, a base electrode making a circular ohmic contact on said surface of said base region leaving exposed an area of said surface surrounded by said base electrode, an alloy emitter region forming a junction barrier with said base region in said exposed area, said emitter region having constant injection efficiency over essentially all the area of said junction barrier, and an ohmic connection to said emitter region.

2. A semiconductor switching device comprising in combination a semiconductor body including emitter, base and collector regions of alternately opposite type conductivity semiconductor material, each region forming a junction barrier with the adjacent region, said base region having a gradual variation in resistivity from a low value at said emitter junction to a higher value at said collector junction, said collector region having a gradual variation in resisitivity from a high value at said collector junction to a lower value in the remainder of said region, said emitter region being an alloyed region having an area that is small in comparison to said base region, said emitter junction having constant injection efficiency over essentially all of the entire area, an ohmic connection made to said emitter region, an ohmic connection made to said collector region and an ohmic base connection made to said base region and substantially surrounding said emitter region.

3. A switching transistor comprising a body of semiconductor material including emitter, base and collector regions of alternately opposite semiconductor material, each separated by a junction barrier; said emitter region being alloyed into said base region having a low resistivity, an area small compared to said base region and a constant injection efficiency over essentially all the area of said emitter junction; said base region having a gradual variation in resistivity from a low value at said emitter junction to a higher value at said collector junction; said collector region having a gradual variation in resistivity from a high value at said collector junction to a lower value in the remainder of said collector region; an ohmic contact to said emitter region; an ohmic contact to said collector region; and an ohmic contact to said base region at least partly surrounding said emitter region.

4. The process of fabricating a switching transistor comprising in combination, the steps of cutting a wafer from a semiconductor crystal having a P type conductivity, diffusing N type conductivity directing impurities into said wafer, heating said wafer in a vacuum, removing a portion of said wafer to provide a wafer having only an N type region and a P type region joined at a barrier, removing a closely controlled quantity from said N type region to establish an exact thickness, forming a small die from said wafer, bonding a circular ohmic connection on said N type surface of said die, attaching an impurity dot to said P type surface of said die and another impurity dot to said N type surface of said die in the center of said circular ohmic connection, fusing said dots into said die forming the body of said transistor, mounting said body in an airtight container with leads exposed, filling said container with a suitable vehicle and sealing said container.

5. The process of fabricating a switching transistor comprising in combination, the steps of cutting a wafer from a semiconductor crystal having an N type conductivity, diffusing P type conductivity directing impurities into said wafer, heating said wafer in a vacuum, removing a portion of said wafer to provide a wafer having only an N type region and a P type region separated by a barrier, removing a closely controlled quantity from said P type region to establish an exact thickness, forming a small die from said wafer, bonding a circular ohmic connection on said P type surface of said die, attaching an impurity dot to said N type surface of said die and another impurity dot to said P type surface of said die in the center of said circular ohmic connection, fusing said dots into said die forming said transistor body, mounting said body in an airtight container with leads exposed, filling said container with a suitable vehicle and sealing said container.

6. The process of making a junction semiconductor device comprising in combination the steps of providing a wafer of a first conductivity type semiconductor material, converting by the gaseous diffusion method a portion of said wafer to the opposite conductivity type, heating said wafer in a vacuum, removing material from said wafer to provide a wafer having two regions with exposed surfaces, said regions being joined at a junction barrier, etching said region of opposite conductivity type to establish exact thickness, providing a small die from said wafer, soldering a circular ohmic connection to said exposed surface of said region of opposite conductivity of said die, attaching a first conductivity directing impurity dot to said exposed surface of said first conductivity type region of said die and a second conductivity directing impurity dot to said exposed surface of said opposite conductivity region of said die at a point surrounded by said circular ohmic connection, fusing said impurities into said die forming thereby a junction semiconductor device body, mounting said body in an airtight container, filling said container with mesitylene and sealing said container.

7. The process of making a junction semiconductor device comprising in combination the steps of providing a wafer of a first conductivity type semiconductor material, converting by the gaseous diffusion method a portion of said wafer to the opposite conductivity type, heating said wafer in a vacuum, removing material from said wafer to provide a wafer having two regions with exposed surfaces, said regions being joined at a junction barrier, etching said region of opposite conductivity type to establish exact thickness, providing a small die from said wafer, soldering a circular ohmic connection to said exposed surface of said region of opposite conductivity of said die, attaching a first conductivity directing impurity dot to said exposed surface of said first conductivity type region of said die and a second conductivity directing inpurity dot to said exposed surface of said opposite conductivity region of said die at a point surrounded by said circular ohmic connection, and forming thereby a junction semiconductor device body, mounting said body in an air tight container, filling said container with mesitylene and sealing said container.

8. A switching transistor comprising a semiconductor body including emitter, base and collector zones each separated by a barrier; said emitter zone being alloyed and having an area that is small compared with said base and collector zones; said body having a resistivity that is low in said emitter zone, gradually increasing in said base zone from a constant specific value over said emitter junction area, said value being near the value in said emitter zone to intrinsic at said collector junction and gradually decreasing in said collector zone from intrinsic at said collector junction to a lower value throughout the remainder of said collector zone and a circular ohmic base connection surrounding said emitter zone.

9. A switching transistor comprising a semiconductor body including emitter, base and collector zones, each separated by a barrier; said emitter zone being alloyed and having an area that is small compared with said base and collector zones; said body having a resistivity that is low in said emitter zone, gradually increasing in said base zone from a constant specific value over said emitter junction area, said value being near the value in said emitter zone, to intrinsic at said collector junction and gradually decreasing in said collector zone from intrinsic at said collector junction to a lower value through the remainder of said collector zone; a circular ohmic base connection surrounding said emitter zone, and an hermetically sealed container surrounding said body and having external leads, extending through said container, connected respectively to said emitter zone, said base connection and said collector zone, and said container being substantially filled with mesitylene.

References Cited in the file of this patent

UNITED STATES PATENTS

| | | |
|---|---|---|
| 2,681,993 | Shockley | June 22, 1954 |
| 2,692,839 | Christensen et al. | Oct. 26, 1954 |